(12) United States Patent
Uemura

(10) Patent No.: US 7,989,836 B2
(45) Date of Patent: Aug. 2, 2011

(54) LIGHT EMITTING ELEMENT HAVING AN IRREGULAR SURFACE, LIGHT EMITTING DEVICE USING THE LIGHT EMITTING ELEMENT, AND METHOD FOR MANUFACTURING LIGHT EMITTING ELEMENT

(75) Inventor: Toshiya Uemura, Aichi (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 12/656,558

(22) Filed: Feb. 3, 2010

(65) Prior Publication Data
US 2010/0140650 A1    Jun. 10, 2010

Related U.S. Application Data

(63) Continuation of application No. 11/730,687, filed on Apr. 3, 2007, now Pat. No. 7,687,817.

(30) Foreign Application Priority Data

Apr. 4, 2006 (JP) .............................. P. 2006-103166
Feb. 26, 2007 (JP) .............................. P. 2007-045275

(51) Int. Cl.
*H01L 29/22*  (2006.01)
*H01L 29/227* (2006.01)
*H01L 33/00*  (2010.01)
*H01L 29/24*  (2006.01)
*H01L 31/0203* (2006.01)
*H01L 21/00*  (2006.01)
*H01L 21/44*  (2006.01)
*H01L 21/48*  (2006.01)
*H01L 21/50*  (2006.01)

(52) U.S. Cl. ............... 257/98; 257/95; 257/99; 257/100; 257/422; 257/434; 257/E33.056; 257/E33.058; 257/E33.059; 257/E33.61; 257/E33.068; 257/E33.073; 257/E33.074; 438/26; 438/116

(58) Field of Classification Search ............. 257/98–100, 257/E33.056, E33.058, E33.059, E33.061, 257/E33.068, E33.073, E33.074, 95, 433, 257/434; 438/26, 116
See application file for complete search history.

(56) References Cited

U.S. PATENT DOCUMENTS

| | | | | |
|---|---|---|---|---|
| 6,091,083 A | 7/2000 | Hata et al. | ......................... | 257/79 |
| 6,614,172 B2* | 9/2003 | Chiu et al. | ..................... | 313/501 |
| 6,809,471 B2 | 10/2004 | Setlur et al. | ..................... | 313/503 |
| 6,870,191 B2 | 3/2005 | Niki et al. | ......................... | 257/79 |
| 6,900,457 B2 | 5/2005 | Toguchi et al. | .................. | 257/40 |

(Continued)

FOREIGN PATENT DOCUMENTS

JP     2003-69075     3/2003

(Continued)

*Primary Examiner* — Ida M Soward
(74) *Attorney, Agent, or Firm* — McGinn IP Law Group, PLLC

(57) ABSTRACT

A light emitting device includes a light emitting element, including a substrate including group III nitride compound semiconductor, a luminous layer structure including group III nitride compound semiconductor, the luminous layer structure formed on a first surface of the substrate, and an irregular surface formed on a second surface of the substrate, the second surface including a principal light emission surface, and a translucent sealing member for sealing the light emitting element, the translucent sealing member being separated from the second surface. At least one of translucent gel material and an inert gas is filled between the light emitting element and the translucent sealing member.

20 Claims, 4 Drawing Sheets

U.S. PATENT DOCUMENTS

| | | |
|---|---|---|
| 6,946,788 B2 | 9/2005 | Suehiro et al. ............... 313/498 |
| 7,009,210 B2 | 3/2006 | Sarathy et al. ................. 257/98 |
| 7,019,334 B2 | 3/2006 | Yatsuda et al. ................ 257/98 |
| 7,023,019 B2 | 4/2006 | Maeda et al. .................. 257/89 |
| 7,157,294 B2 | 1/2007 | Uemura et al. ................ 438/27 |
| 7,170,100 B2 * | 1/2007 | Erchak et al. .................. 257/88 |
| 7,195,733 B2 | 3/2007 | Rogers et al. ................ 264/496 |
| 7,285,800 B2 | 10/2007 | Lai et al. ........................ 257/81 |
| 7,301,175 B2 * | 11/2007 | Izuno et al. .................... 257/98 |
| 7,312,477 B2 * | 12/2007 | Yatsuda et al. ................ 257/98 |
| 7,378,686 B2 | 5/2008 | Beeson et al. ............... 257/100 |
| 7,423,284 B2 * | 9/2008 | Nagai et al. .................... 257/21 |
| 7,427,806 B2 * | 9/2008 | Arndt et al. .................. 257/682 |
| 7,612,383 B2 * | 11/2009 | Andrews et al. ............... 257/98 |
| 7,622,748 B2 * | 11/2009 | Yatsuda et al. ................ 257/98 |
| 7,737,460 B2 * | 6/2010 | Fujimoto et al. .............. 257/99 |
| 2002/0125485 A1 | 9/2002 | Steigerwald et al. .......... 257/79 |
| 2003/0164505 A1 | 9/2003 | Streubel et al. ............... 257/80 |
| 2003/0178626 A1 | 9/2003 | Sugiyama et al. ............. 257/79 |
| 2004/0099862 A1 * | 5/2004 | Suzuki et al. .................. 257/40 |
| 2004/0201987 A1 | 10/2004 | Omata ......................... 362/230 |
| 2004/0251469 A1 * | 12/2004 | Yatsuda et al. .............. 257/100 |
| 2005/0156496 A1 | 7/2005 | Takashima et al. .......... 313/237 |
| 2006/0027828 A1 | 2/2006 | Kikuchi ......................... 257/99 |
| 2006/0060888 A1 | 3/2006 | Kim et al. .................... 257/200 |
| 2006/0145170 A1 * | 7/2006 | Cho ............................... 257/95 |
| 2006/0157717 A1 | 7/2006 | Nagai et al. .................... 257/81 |
| 2006/0255713 A1 | 11/2006 | Kondo et al. ................ 313/486 |
| 2007/0017294 A1 * | 1/2007 | Asada et al. ................... 73/754 |
| 2007/0131954 A1 | 6/2007 | Murayama et al. ............ 257/98 |
| 2008/0212305 A1 | 9/2008 | Kawana et al. ................ 362/84 |
| 2008/0258110 A1 * | 10/2008 | Oshio .................... 252/301.6 R |
| 2009/0057698 A1 * | 3/2009 | Okamura et al. .............. 257/98 |

FOREIGN PATENT DOCUMENTS

| | | |
|---|---|---|
| JP | 2003-347601 | 12/2003 |

* cited by examiner

LIGHT EMITTING ELEMENT HAVING AN IRREGULAR SURFACE, LIGHT EMITTING DEVICE USING THE LIGHT EMITTING ELEMENT, AND METHOD FOR MANUFACTURING LIGHT EMITTING ELEMENT

CROSS-REFERENCE TO RELATED APPLICATIONS

The present Application is a Continuation Application of U.S. patent application Ser. No. 11/730,687 filed on Apr. 3, 2007 now U.S. Pat. No. 7,687,817. The present Application is based on and claims priority to Japanese patent application No. 2006-103166 filed on Apr. 4, 2006 and Japanese patent application No. 2007-045275 filed on Feb. 26, 2007, the entire contents of which are incorporated herein by reference.

BACKGROUND OF THE INVENTION

1. Field of the Invention

The present invention relates to a light emitting element made of III nitride compound semiconductor, a light emitting device using the light emitting element, and a method for manufacturing the light emitting element.

2. Description of the Related Art

In the light emitting element made of III nitride compound semiconductor, a so-called flip chip structure is used to obtain a high light extraction efficiency. In this flip chip structure, the back side of a sapphire substrate is directed toward the light emitting direction with the luminous layer structure composed of a multiple quantum well structure on the under side. Thereby, the light emitted from the luminous layer is not intercepted by a non-translucent member such as an electrode.

In order to obtain a higher light extraction efficiency in this flip chip structure, a technique for forming irregularities on the back side of the sapphire substrate was described in Japanese patent application 2003-347601.

Also, refer to Japanese patent application 2003-69075 that discloses the techniques associated with the invention.

The incident angle of light on the interface between the back side of the sapphire substrate and the outside world can be varied by providing irregularities on the back side of the sapphire substrate. As a result, though the light is totally reflected on the interface when there are not the irregularities, some of the light has a smaller incident angle than the critical angle due to the irregularities, whereby the quantity of light emerging from the sapphire substrate to the outside world increases. That is, the light extraction efficiency is improved.

However, since there is the interface between the sapphire substrate and the luminous layer structure made of III nitride compound semiconductor and both the substrates have different refractive indexes; some of the light emitted from the luminous layer structure is reflected from the interface between the sapphire substrate and III nitride compound semiconductor layer.

Further, the irregularities on the back side of the sapphire substrate as disclosed in Japanese patent application 2003-347601 are nonparallel to the reflecting surface of the light emitting element, thereby reducing the quantity of totally reflected light. In other words, the total reflection on the interface between the sapphire substrate and the outside world is not completely eliminated.

SUMMARY OF THE INVENTION

Thus, it is an exemplary object of this invention to provide a light emitting element that can extract substantially all the light emitted from the luminous layer structure to the outside.

In order to accomplish the above exemplary object, an exemplary embodiment of the invention is stated as a III nitrogen compound semiconductor light emitting element, comprising a substrate made of III nitride compound semiconductor, a luminous layer structure made of III nitride compound semiconductor formed on a first surface of the substrate, and an irregular surface formed on a second surface of the substrate, the pitch of the irregular surface being shorter than the wavelength of light emitted from the luminous layer structure.

With the light emitting element exemplarily embodied in this manner, since both the substrate and the luminous layer structure are formed of III nitride compound semiconductor, both the refractive indexes are substantially equal, so that the light is not totally reflected on the interface between both.

Further, since the irregular surface is provided on the second surface of the substrate that becomes the light emission surface, the pitch of the irregular surface being shorter than the wavelength of the light emitted from the luminous layer structure, a graded area of the refractive index is only formed between the substrate and the outside world, but the interface between the substrate and the outside world does not exist. Hence, there is no total reflection on the interface between the substrate and the outside world, whereby all the light transmitted from the luminous layer structure through the substrate can be extracted to the outside world (see FIG. 1).

Also, since the substrate is made of III nitride compound semiconductor, and the sapphire substrate is not provided, the outgoing ratio of the light from an end surface (side face) of the light emitting element is small. Therefore, even if total reflection occurs between the end face and the outside world, the outgoing ratio from the end face is small, and has almost no influence on the light extraction efficiency over the entire light emitting element.

In the above exemplary embodiment, the pitch of the irregular surface is preferably closer to the light emission wavelength of the light emitting element. For example, the pitch of the irregular surface may be from 10 to 300% of the light emission wavelength.

A method for forming such irregular surface is not specifically limited, but the following exemplary method may be adopted.

The second surface of the substrate made of III nitride compound semiconductor is soaked in an alkali solution such as KOH, and a light having a shorter wavelength than the wavelength corresponding to a band gap of III nitride compound semiconductor (light having a wavelength shorter than about 365 nm) is applied to the second surface. Thereby, minute irregularities are formed on the second surface, and visually observed as a whitish state. The light applied on the second surface may be monochromatic light or continuous light. Also, the light may be applied continuously or intermittently.

The minute irregularities are formed on the surface by applying the light having a shorter wavelength than the wavelength corresponding to the band gap of III nitride compound semiconductor to excite electrons on the semiconductor surface, and by etching in the alkali solution.

Similarly, the minute irregularities can be formed by heating the III nitride compound semiconductor in contact with the alkali solution.

The heating method is not specifically limited, but may exemplarily involve raising the temperature of the alkali solution itself or applying the heat ray (far infrared ray having a wavelength of about 40 μm).

The light emitting element exemplarily embodied in this manner may have a principal light emission surface that is the second surface.

With the light emitting element of this invention, since all the light emitted from the luminous layer structure is emitted from the substrate made of III nitride compound semiconductor, there is a great influence on the sealing member for the light emitting element, if the wavelength of emitted light is short.

Thus, an exemplary aspect of the invention includes that the sealing member is separated from the second surface (light emission surface) of the light emitting element.

Since the light outgoing from the second surface of the substrate is diffused as it leaves away from the second surface, the intensity of light per unit area is lower when the light is incident upon the sealing member. Accordingly, the sealing member made of resin can be used without deterioration and discoloration.

Hence, the high light extraction efficiency and the longer life of the entire light emitting device can be secured.

As described above, when the sealing member is separated away from the light emitting element, a translucent material can be filled between the light emitting element and the sealing member.

If there is an air layer between the light emitting element and the sealing member, halogen (particularly chlorine) in the air may possibly have adverse influence on the light emitting element. Especially when the light emitting element has a higher output, the influence of halogen is not negligible. Thus, an exemplary aspect of the invention forms the sealing member in a state separated from the light emitting element in the vacuum environment or the environment of inert gas such as nitrogen gas or rare gas.

However, the forming operation in such environment takes a lot of work and cost.

Thus, another material may be filled between the light emitting element and the sealing member. This material exemplarily has a smaller hardness than the sealing member. Thereby, the filling material exhibits a physical buffer action, so that the impact resistance of the light emitting device is improved.

Further, the filling material is exemplarily like a gel. If such filling material is used, the air can be excluded from around the light emitting element by simply potting it on the light emitting element. Thereafter, the sealing member can be formed by a well-known method without passing through the vacuum environment or inert gas environment. Thereby, the cheap light emitting device can be provided. Since the gel-like filling material is conforms on the peripheral surface of the light emitting element and the sealing member, it is possible to fill it without interstices between the light emitting element and the sealing member.

An exemplary aspect of the invention provides that the filling material does not discolor under the influence of light and heat from the light emitting element.

Examples of such gel-like filling material may include silicon gel, polyimide gel and fluorine gel.

If the filling material is filled between the light emitting element and the sealing member, the total reflection on the surface of the sealing member opposed to the light emitting element can be prevented beforehand, because the refractive index of the filling material is higher than the refractive index of the vacuum. Hence, the higher light extraction efficiency can be achieved.

DESCRIPTION OF EXEMPLARY EMBODIMENTS OF THE INVENTION

Exemplary embodiments of this invention will be described below.

Figure 2:
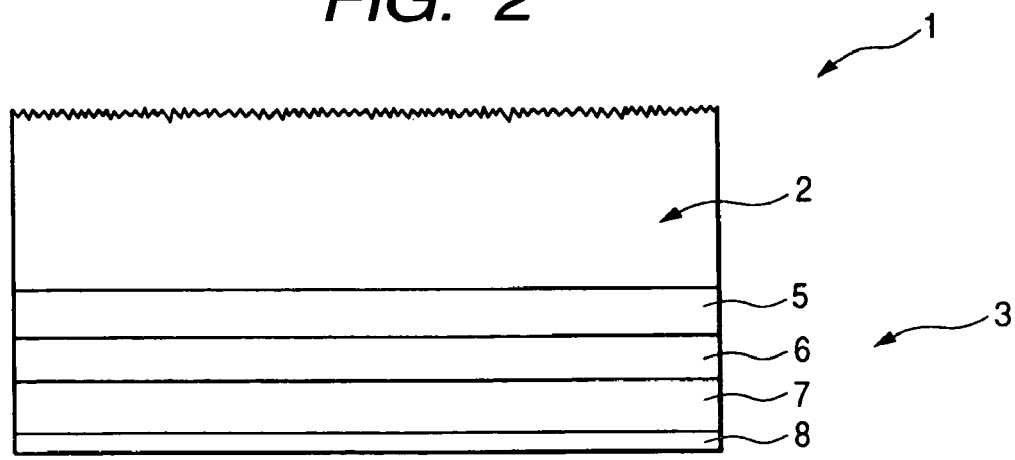
FIG. 2 is a typical view showing an exemplary aspect of the light emitting element.

FIG. 2 shows a light emitting element 1 of an exemplary embodiment.

This light emitting element 1 comprises a substrate 2 and a luminous layer structure 3.

The entire upper surface (light emission surface, second surface) of the substrate 2 made of GaN is formed with minute irregularities. The pitch of irregularities is about 200 nm, and form a graded area of refractive index for the light emitted from the luminous layer structure 3 (see FIG. 1).

The conductive type of the substrate 2 is not specifically limited, but is preferably the n-type to secure an excellent conductivity for the substrate 2. Also, the thickness of the substrate 2 is not specifically limited, but is preferably from about 1 μm to 10 μm.

The luminous layer structure 3 is laminated on the under surface (light emission surface, first surface) of the substrate 2, and comprises at least the clad layers 5 and 7, a luminous layer 6 and an electrode layer 8.

Reference numeral 5 and 7 denote the clad layer. The luminous layer 6 is interposed between the clad layers 5 and 7. The clad layer 5 is n-type and the clad layer 7 is p-type.

Each of the clad layers 5 and 7 may be composed of a plurality of layers and/or a super-lattice structure. A contact layer may be interposed between the clad layer 7 and the electrode layer 8.

The luminous layer 3 may comprise a quantum well structure (multiple quantum well structure, or single quantum well structure), and the structure of the light emitting element may be single hetero type, double hetero type or homo-junction type.

The electrode layer 8 is laminated on the entire surface of the clad layer 7 to supply current to the entire surface of the light emitting element 6 evenly, and reflect the light from the luminous layer 6 upwards (toward the light emission surface of the substrate 2). A reflecting layer may be provided separately from the electrode layer 8.

With the light emitting element 1 of such an exemplary embodiment, the light emitted from the luminous layer 6 (partly reflected from the electrode layer 8) arrives at the surface of the substrate 2, and emitted to the outside without being totally reflected.

The light emitting element 1 of this exemplary embodiment does not have the layer made of any other material than the III nitride compound semiconductor such as sapphire substrate, in which there occurs no reflection of light on the interface between the III nitride compound semiconductor and the sapphire substrate. Accordingly, the light extraction efficiency of the light emitted from the luminous layer 6 is improved.

In the above, the III nitride compound semiconductor is represented in a quarternary system of $Al_xGaYIn_{1-x-y}N$ ($0 \leq X \leq 1$, $0 \leq Y \leq 1$, $0 \leq X+Y \leq 1$) as the general expression, which subsumes a so-called binary system of AlN, GaN and InN, and a so-called ternary system of $Al_xGa_{1-x}N$, $Al_xIn_{1-x}N$ and $Ga_xIn_{1-x}N$ ($0 \leq x \leq 1$). A part of the III element may be replaced with boron (B) or thallium (Tl), and a part of nitrogen (N) may be replaced with phosphorous (P), arsenic (As), antimony (Sb) or bismuth (Bi). Also, the luminous layer may contain any dopant.

Also, the n-type impurities doped into the n-type layer may include Si, Ge, Se, Te and C.

The p-type layer can be similarly formed of III nitride compound semiconductor. The p-type impurities doped into the p-type layer may include Mg, Zn, Be, Ca, Sr and Ba.

The electrode layer 8 can be formed of metal containing gold.

In the light emitting element 1 of the exemplary embodiment, each III nitride compound semiconductor layer can be formed by an MOCVD method. In addition, a molecular beam crystal growth method (MBE method), a halide vapor phase growth method (HVPE method), a sputtering method, an ion plating method, an electronic shower method and so forth may be employed.

The electrode layer 8 can be formed by vapor deposition.

Figure 3:
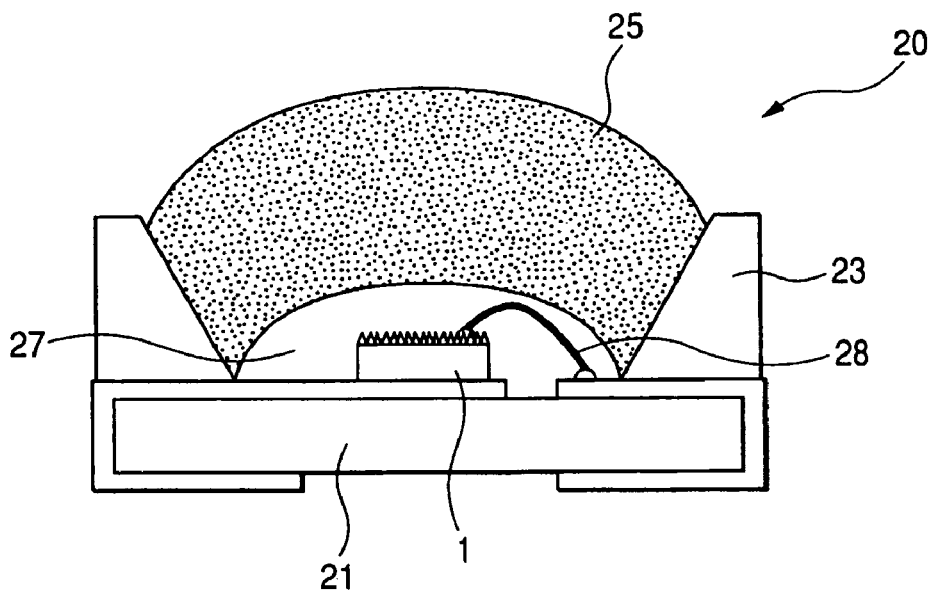
FIG. 3 shows an exemplary aspect of a light emitting device according to the exemplary embodiment.

FIG. 3 shows a light emitting device 20 having the light emitting element 1. As shown in FIG. 3, the light emitting element 1 is mounted on a base substance 21 of the light emitting device 20 with the substrate 2 on the upper side. In FIG. 3, reference numeral 23 denotes a reflecting member and reference numeral 25 denotes a sealing member.

The sealing member 25 is separated away from the light emitting element 1, and a space portion 27 is formed between both. The distance between the sealing member 25 and the light emission surface of the light emitting element 1 is preferably 50 μm or more, and more preferably 100 μm or more. The material and shape of the sealing member 25 can be arbitrarily designed according to the uses and purposes of the light emitting device 20. Also, phosphor grains may be dispersed in the sealing member 25, as shown in FIG. 4.

Owing to the existence of the space portion 27, the sealing member 25 is not discolored by the light emitted from the light emitting element 1, even if the sealing member 25 is made of resin. This is because when the light emitted from the light emitting element 1 is dispersed in the space portion 27 to enter the sealing member 25, the quantity of light per unit area is reduced.

Also, owing to the existence of the space portion 27, a bonding wire 28 does not interfere with the sealing member 25, whereby the yield in manufacturing the light emitting device 20 is increased.

Figure 4:
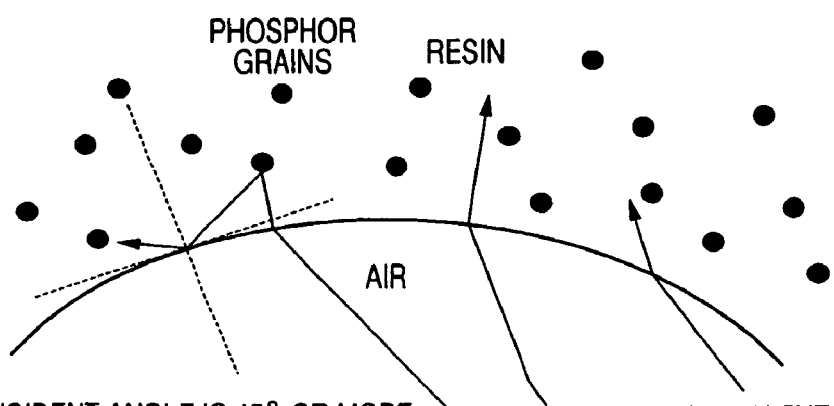
FIG. 4 is a typical view showing an exemplary aspect of a sealing member in the light emitting device.

The light of which the incident angle is 45 degrees or more on the interface between the space portion 27 and the sealing member 25 is reflected from the interface, but is irregularly reflected on a peripheral surface of the space portion 27 to arrive at the interface again, as shown in FIG. 4. By repeating this, the light can finally enter the sealing member 25. Hence, all the light emitted from the light emitting element 1 can be introduced into the sealing member 25.

The light introduced into the sealing member 25 is transmitted through the sealing member 25, or excites the phosphor grains to generate fluorescent light.

Figure 5A:
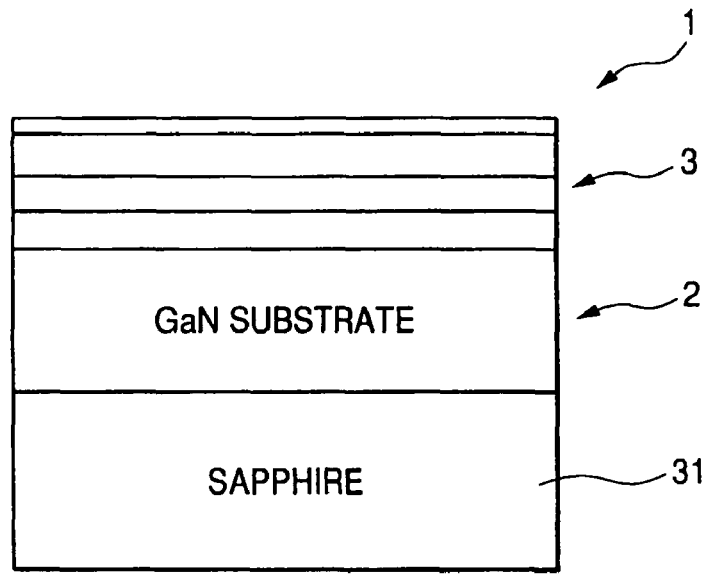
FIG. 5 is a typical view showing an exemplary method for manufacturing the light emitting element.
Figure 5B:
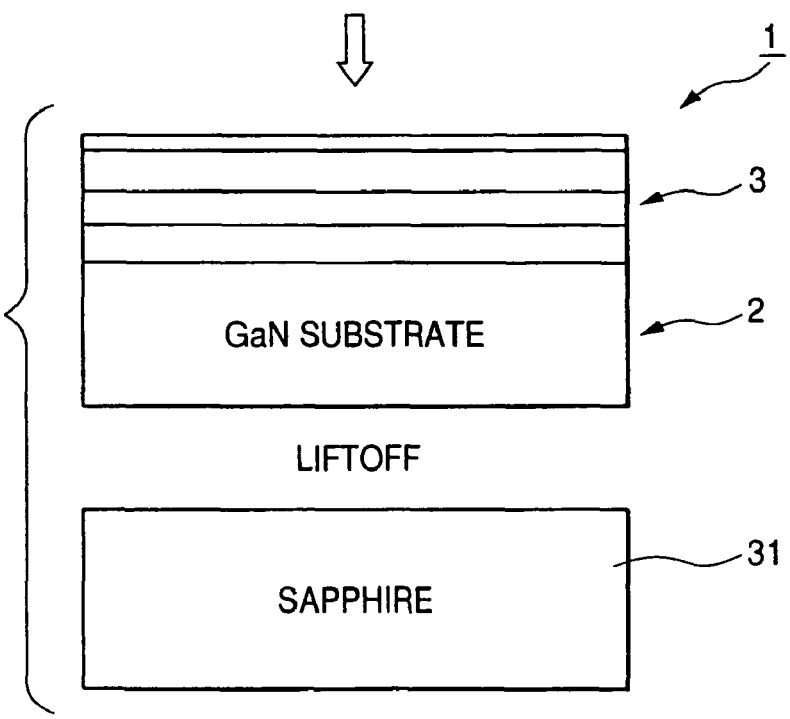
Figure 6:
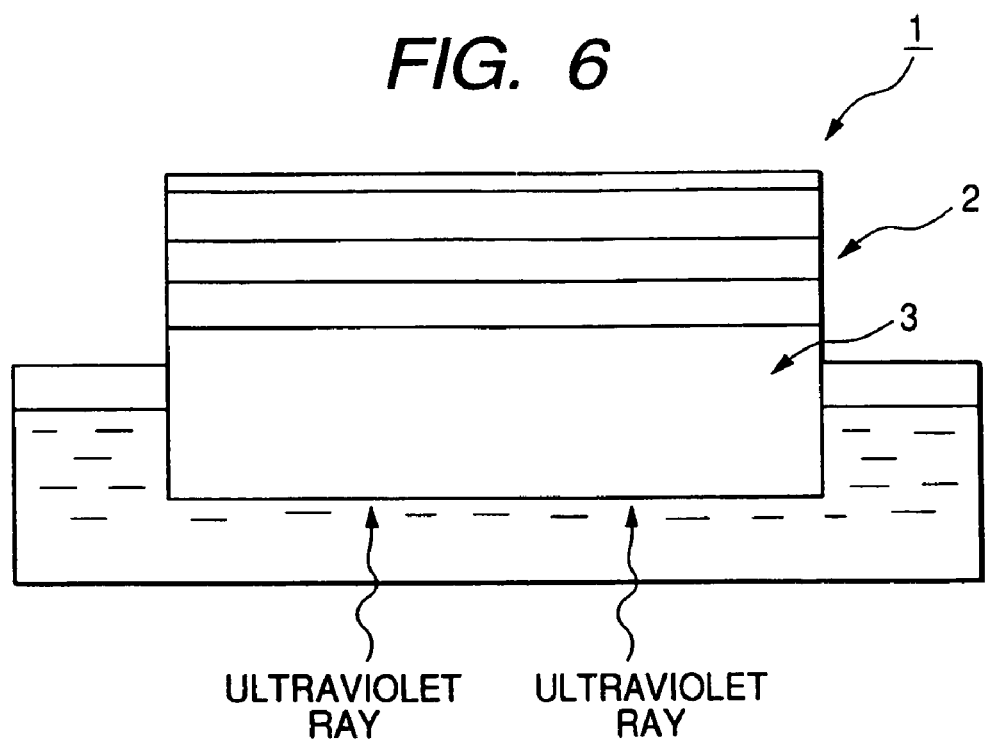
FIG. 6 shows an exemplary method for forming minute irregularities on the GaN substrate.

The light emitting element 1 of FIG. 2 is manufactured as shown in FIGS. 5 and 6. In the FIGS. 5 and 6, the same parts are designated by the same numerals as in FIG. 2, and not described here.

First of all, the III nitride compound semiconductor layer is epitaxially grown on a sapphire substrate 31 by a regular method such as an MOCVD method to form the substrate 2 and the luminous layer structure 3, as shown in FIG. 5A.

Herein, spinel, silicon, silicon carbide, zinc oxide, gallium phosphide, gallium arsenide, magnesium oxide, or manganese oxide may be used, instead of sapphire for the growth substrate.

Then, the sapphire substrate 31 can be separated from the GaN substrate 2 by a laser lift-off method, as shown in FIG. 5B. The execution conditions of the laser lift-off are such that the wavelength is 248 nm and the laser output is 0.7 J/cm$^2$ or more, when a KrF laser is used as the laser beam. Since the output of the KrF laser can be increased, the optical energy required for the lift-off can be applied even on the focus of wide area. Accordingly, the lift-off can be made efficiently.

When a YAG laser is used as the laser beam, the wavelength can be 355 nm and the laser output can be 0.6 J/cm$^2$ or more. With the YAG laser, the radiation time of pulse laser beam can be shortened, whereby the catastrophic laser output is high. Therefore, the average laser output can be lowered, whereby damage on the light emitting element is suppressed.

The GaN substrate 2 is soaked in the KOH aqueous solution (concentration: 1 mol/l, temperature: 15° C., and ultraviolet ray (output 10 to 30 mM/cm$^2$) is continuously applied onto the surface of the GaN substrate for one minute, as shown in FIG. 6. Thereby, the surface of the GaN substrate 2 becomes whitish. As a result of the examinations of the present inventors, it was found that minute irregularities were formed over the entire surface of the whitish portion almost uniformly. The pitch (average) of irregularities was about 200 nm. Also, the average depth (height) of irregularities was about 200 nm.

Figure 1:
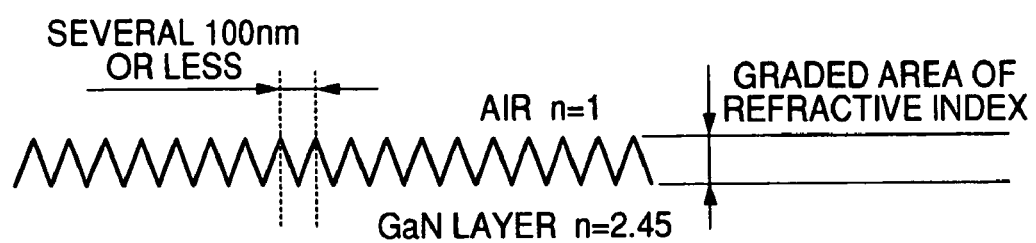
FIG. 1 is a typical view showing the surface structure of a substrate for a light emitting element according to an exemplary embodiment of the present invention.

Since the pitch of irregularities is shorter than the wavelength of the light emitted from the luminous layer, the surface of the GaN substrate 2 does not form the interface for the light (see FIG. 1).

Though in the above embodiment, the irregular surface is formed by applying ultraviolet ray to the GaN substrate 2 soaked in the KOH aqueous solution, the irregular surface may be also formed by heating the surface of the GaN substrate 2 soaked in the KOH aqueous solution (roughly 50° C. (10 minutes). The heating methods include heating the KOH aqueous solution and applying heat ray (far infrared radiation) to the GaN substrate 2.

In the above, the concentration of the KOH aqueous solution is preferably 0.3 mol/l or more. The heating time is preferably one minute or more.

The surface is also roughened by soaking the GaN substrate in the KOH aqueous solution under room temperature conditions for a long time. For example, the KOH aqueous solution having a concentration of 1 mol/l is kept at room temperature (about 15° C.), and the GaN substrate is soaked for 180 minutes to roughen its surface. In the above, the concentration of the KOH aqueous solution is preferably 0.3 mol/l or more.

Figure 7:
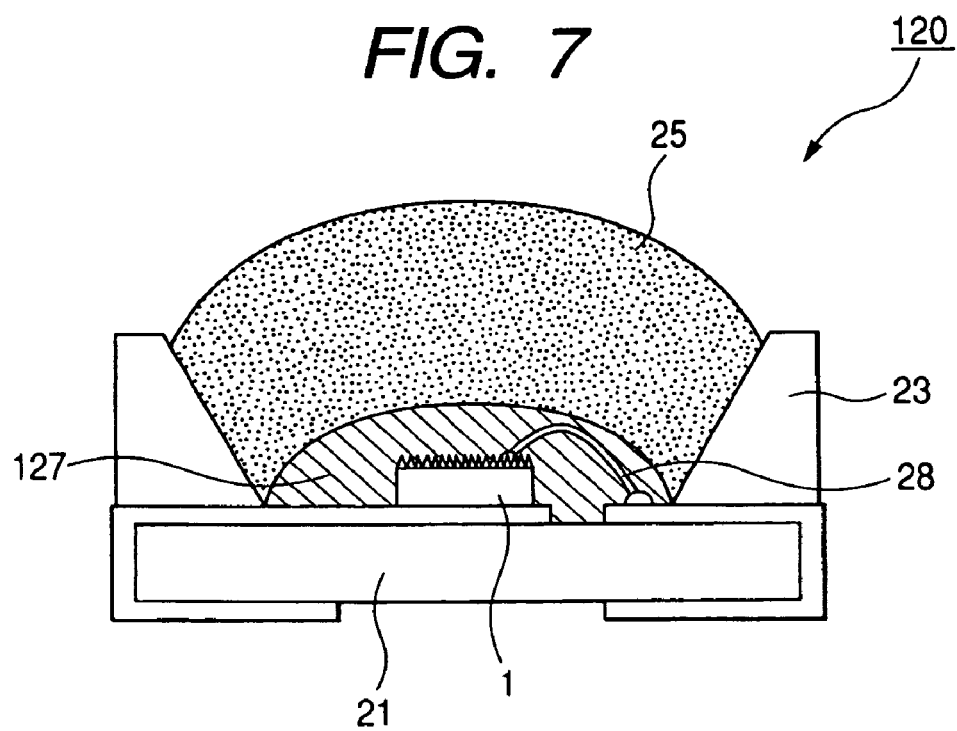
FIG. 7 shows a light emitting device 120 according to another exemplary embodiment.

FIG. 7 shows a light emitting device 120 according to another embodiment. The same parts are denoted by the same reference numerals as in FIG. 3, and the explanation of the same parts is omitted.

In the light emitting device 120 of this embodiment, the filling material 127 composed of fluorine gel (trade name: SIFEL, company name The Shin-Etsu Chemical Co., Ltd.) is filled without interstices between the light emitting element 1 and the sealing member 25.

Such light emitting device 120 is produced in the following manner. The light emitting element 1 is mounted on the base substance 21, and a potting wire 28 is additionally provided. A fluorine gel is potted on this light emitting element 1, and then an epoxy resin is potted on the fluorine gel. And the epoxy resin is cured to make the light emitting device 120 as shown in FIG. 7. Also, the epoxy resin after curing may be covered on the fluorine gel to make the light emitting device 120.

With the light emitting device 120 exemplarily embodied in this manner, the flexible filling material 127 is interposed between the light emitting element 120 and the sealing member 25, whereby the impact resistance is excellent. Also, since the light emitting element 1 can be surrounded by the filling material 127, the light emitting element 1 can be isolated from other harmful chemical substances. With the above, the light emitting device 120 of this embodiment has more excellent durability.

This invention is not limited to the above embodiment of the invention and the description of the embodiment. It will be understood to those skilled in the art that various modifications may be made thereto without departing from the scope of the invention as defined in the claims.

What is claimed is:

1. A light emitting device, comprising:
    a light emitting element, comprising:
        a substrate comprising group III nitride compound semiconductor;
        a luminous layer structure comprising group III nitride compound semiconductor, said luminous layer structure formed on a first surface of said substrate; and
        an irregular surface formed on a second surface of said substrate, said second surface comprising a principal light emission surface; and
    a translucent sealing member for sealing said light emitting element, said translucent sealing member being separated from said second surface,
    wherein at least one of translucent gel material and an inert gas is filled between said light emitting element and said translucent sealing member.

2. The light emitting device according to claim 1, wherein said translucent gel material comprises at least one of a silicon gel, a polyimide, and a fluoride gel.

3. The light emitting device according to claim 2, wherein the gel material comprises fluorine gel.

4. The light emitting device according to claim 3, wherein the inert gas comprises at least one of nitrogen gas and rare gas.

5. The light emitting device according to claim 1, wherein said translucent sealing member comprises a resin.

6. The light emitting device according to claim 5, wherein the resin comprises an epoxy resin.

7. The light emitting device according to claim 5, wherein phosphor grains are dispersed in said resin.

8. The light emitting device according to claim 1, wherein the light emitting element is mounted on a base substrate, and wherein a reflecting member is formed on the base substrate surrounding the light emitting element.

9. The light emitting device according to claim 1, wherein an inner surface of the translucent sealing member is formed in a spherical surface.

10. The light emitting device according to claim 1, wherein an outer surface of the translucent sealing member is formed in a spherical surface.

11. The light emitting device according to claim 1, wherein the translucent gel material comprises a different material than that of the translucent sealing member.

12. The light emitting device according to claim 1, wherein the at least one of the translucent gel material and the inert gas is filled in a space portion located between the light emitting element and the translucent sealing member.

13. The light emitting device according to claim 1, further comprising a space portion between the light emitting element and the translucent sealing member, wherein the space portion is filled with the at least one of the translucent gel material and the inert gas.

14. The light emitting device according to claim 13, wherein the space portion creates a buffer between the light emitting element and the translucent sealing member.

15. The light emitting device according to claim 1, wherein the translucent gel material has a smaller hardness than the translucent sealing member.

16. The light emitting device, comprising:
    a light emitting element, comprising:
        a substrate;
        a luminous layer structure formed on a first surface of the substrate; and
        an irregular surface formed on a second surface of the substrate, the second surface comprising a principal light emission surface;
    a translucent sealing member for sealing the light emitting element; and
    a space portion located between the light emitting element and the translucent sealing member,
    wherein the space portion is filled with at least one of a translucent gel material that comprises a material different than that of the translucent sealing member, and an inert gas.

17. The light emitting device according to claim 16, wherein, if an incident angle of a light is 45 degrees or more on an interface between the space portion and the sealing member, the light is repeatedly reflected within the sealing member to arrive at the interface.

18. A method of forming a light emitting device, comprising:
    forming a light emitting element, comprising:
        forming a substrate;
        forming a luminous layer structure on a first surface of the substrate; and
        forming an irregular surface on a second surface of the substrate;
    forming a translucent sealing member; and
    forming a space portion between the light emitting element and the translucent sealing member,
    wherein the space portion is filled with at least one of a translucent gel material that comprises a material different than that of the translucent sealing member, and an inert gas.

19. The method according to claim 18, wherein said forming the luminous layer comprises:
    growing a group III nitride compound semiconductor on a sapphire substrate;
    separating the sapphire substrate from the group III nitride compound semiconductor by a laser lift-off method;
    soaking the group III nitride compound semiconductor in a KOH aqueous solution; and
    applying ultraviolet light on a surface of the group III nitride compound semiconductor for about one minute.

20. The method according to claim 18, wherein said forming the irregular surface comprises:
    heating the second surface of the substrate while soaking the second surface of the substrate in a KOH aqueous solution for about ten minutes.

* * * * *